United States Patent
Shih et al.

(10) Patent No.: US 10,014,218 B1
(45) Date of Patent: Jul. 3, 2018

(54) METHOD FOR FORMING SEMICONDUCTOR DEVICE STRUCTURE WITH BUMPS

(71) Applicant: Taiwan Semiconductor Manufacturing Co., Ltd., Hsinchu (TW)

(72) Inventors: Meng-Fu Shih, Nantou County (TW); Cheng-Lin Huang, Hsinchu (TW); Chien-Chen Li, Hsinchu (TW); Che-Jung Chu, Hsinchu (TW); Wen-Ming Chen, Zhunan Township, Miaoli County (TW); Kuo-Chio Liu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/492,525

(22) Filed: Apr. 20, 2017

(51) Int. Cl.
*H01L 23/48* (2006.01)
*H01L 21/78* (2006.01)
(Continued)

(52) U.S. Cl.
CPC ............ *H01L 21/78* (2013.01); *H01L 21/561* (2013.01); *H01L 21/563* (2013.01); *H01L 21/76879* (2013.01); *H01L 23/5226* (2013.01); *H01L 23/544* (2013.01); *H01L 24/09* (2013.01); *H01L 24/11* (2013.01); *H01L 24/17* (2013.01); *H01L 2223/5446* (2013.01); *H01L 2224/0401* (2013.01); *H01L 2224/1403* (2013.01);
(Continued)

(58) Field of Classification Search
CPC ......... H01L 24/09; H01L 24/11; H01L 24/14; H01L 24/73; H01L 2224/73204; H01L 2224/1403; H01L 2224/14051; H01L 2224/14131; H01L 2224/1703; H01L 2224/3003; H01L 2224/30131; H01L 2224/0903; H01L 2224/1181; H01L 23/5226; H01L 23/544; H01L 23/49816; H01L 23/49827; H01L 21/561; H01L 21/563; H01L 21/76879
See application file for complete search history.

(56) References Cited

U.S. PATENT DOCUMENTS 8,802,504 B1  8/2014 Hou et al.
8,803,292 B2  8/2014 Chen et al.
(Continued)

*Primary Examiner* — Michael Trinh
(74) *Attorney, Agent, or Firm* — McClure, Qualey & Rodack, LLP

(57) ABSTRACT

A method for forming a semiconductor device structure is provided. The method includes providing a semiconductor structure. The semiconductor structure has a central portion and a peripheral portion surrounding the central portion. The method includes forming first conductive bumps and dummy conductive bumps over a surface of the semiconductor structure. The first conductive bumps are over the central portion and electrically connected to the semiconductor structure. The dummy conductive bumps are over the peripheral portion and electrically insulated from the semiconductor structure. The first conductive bumps each have a first thickness and a first width. The dummy conductive bumps each have a second thickness and a second width. The second thickness is less than the first thickness. The second width is greater than the first width.

20 Claims, 17 Drawing Sheets

(51) Int. Cl.
*H01L 23/00* (2006.01)
*H01L 23/544* (2006.01)
*H01L 21/56* (2006.01)
*H01L 23/522* (2006.01)
*H01L 21/768* (2006.01)

(52) U.S. Cl.
CPC ............... *H01L 2224/14131* (2013.01); *H01L 2224/1713* (2013.01); *H01L 2224/3003* (2013.01); *H01L 2224/73204* (2013.01)

(56) References Cited

U.S. PATENT DOCUMENTS

| | | |
|---|---|---|
| 8,803,316 B2 | 8/2014 | Lin et al. |
| 8,970,035 B2* | 3/2015 | Lin .......................... H01L 24/06 |
| | | 257/737 |
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,496,189 B2 | 11/2016 | Yu et al. |
| 2014/0167254 A1* | 6/2014 | Yu ........................... H01L 24/13 |
| | | 257/737 |
| 2015/0221577 A1* | 8/2015 | Liou ..................... H01L 23/147 |
| | | 257/692 |
| 2016/0086902 A1* | 3/2016 | Lu ........................... H01L 24/14 |
| | | 257/737 |

\* cited by examiner

METHOD FOR FORMING SEMICONDUCTOR DEVICE STRUCTURE WITH BUMPS

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 1A-1 to 1D-1 are top views of the semiconductor device structure of FIGS. 1A-1D, in accordance with some embodiments.

FIG. 1A-2 is a cross-sectional view illustrating the semiconductor device structure along a sectional line II-II' in FIG. 1A-1, in accordance with some embodiments.

FIG. 1I-1 is a top view of the semiconductor device structure of FIG. 1I, in accordance with some embodiments.

FIG. 2 is a top view of a semiconductor device structure, in accordance with some embodiments.

DETAILED DESCRIPTION

Figure 1A:
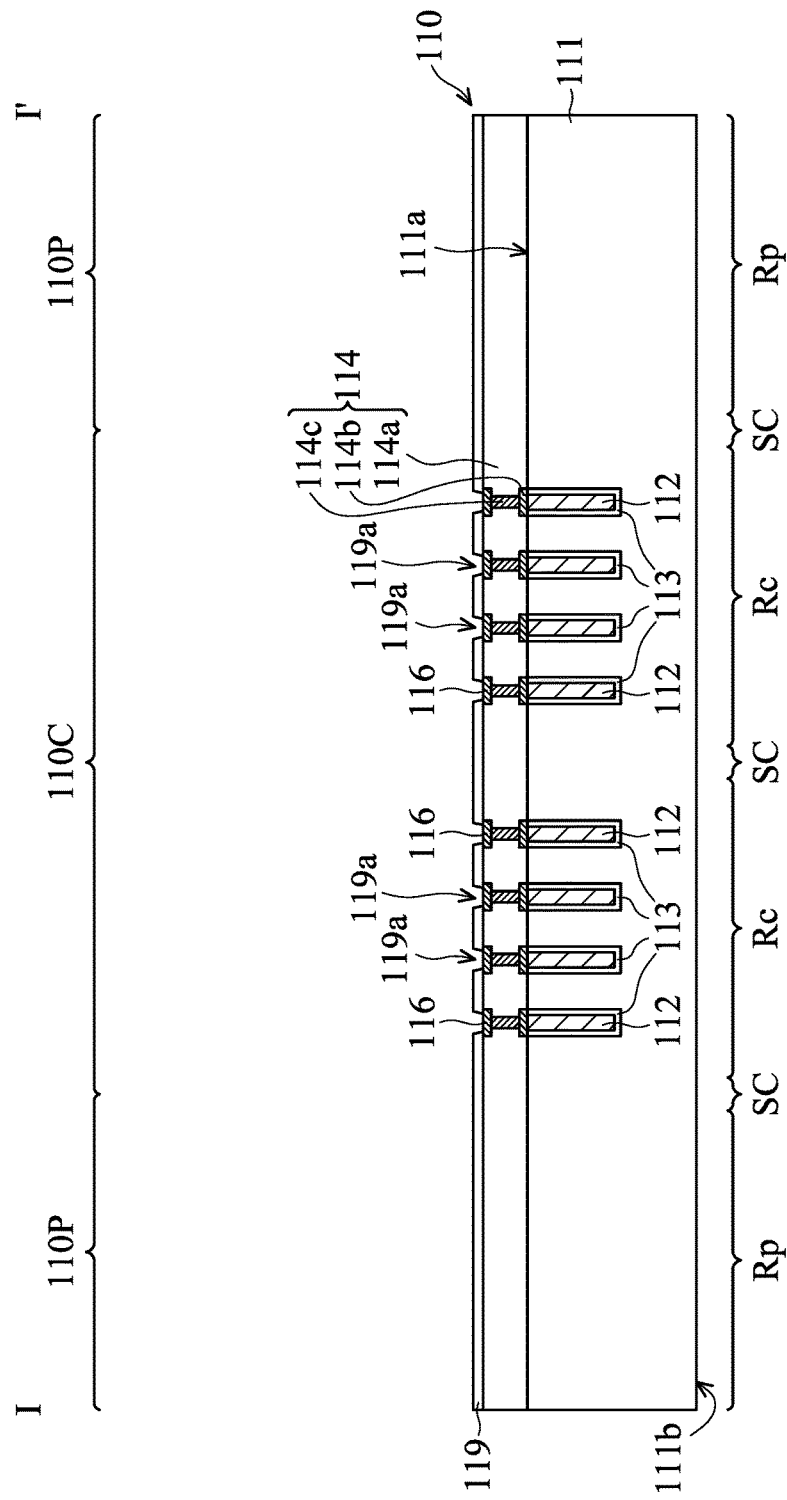
FIGS. 1A-1I are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figures 1, 1A:
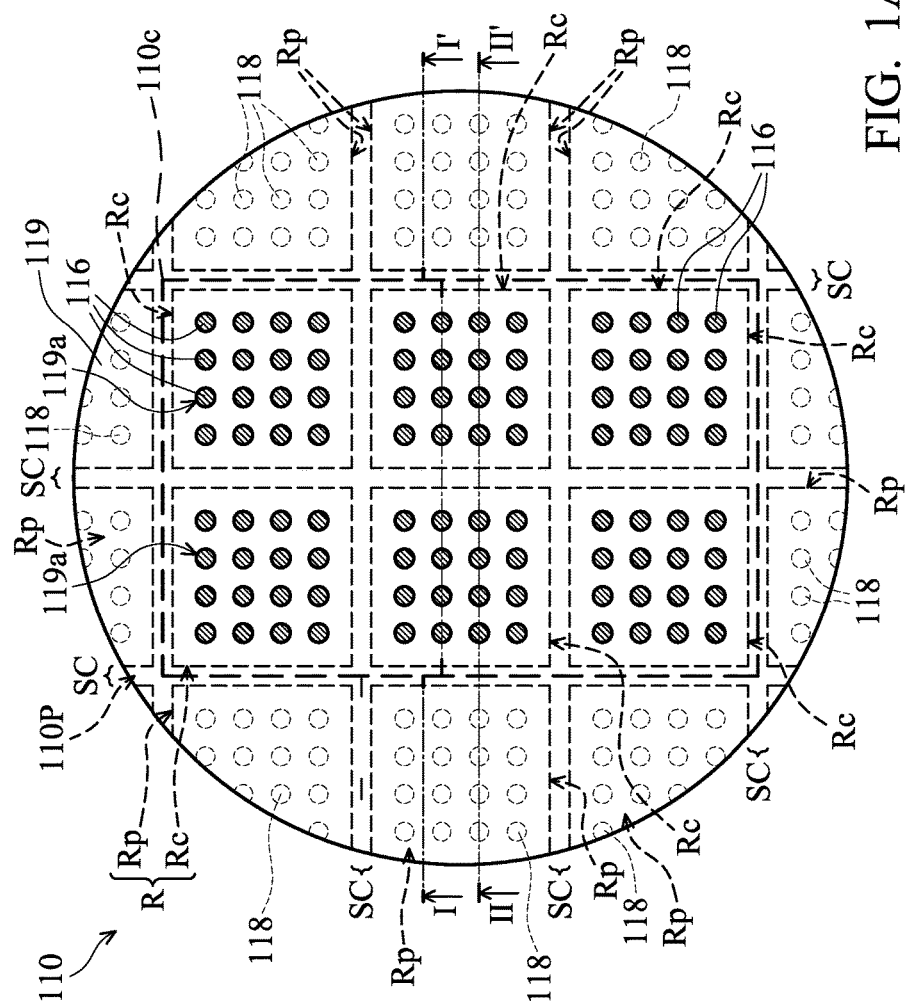
Figures 1, 1A, 2:
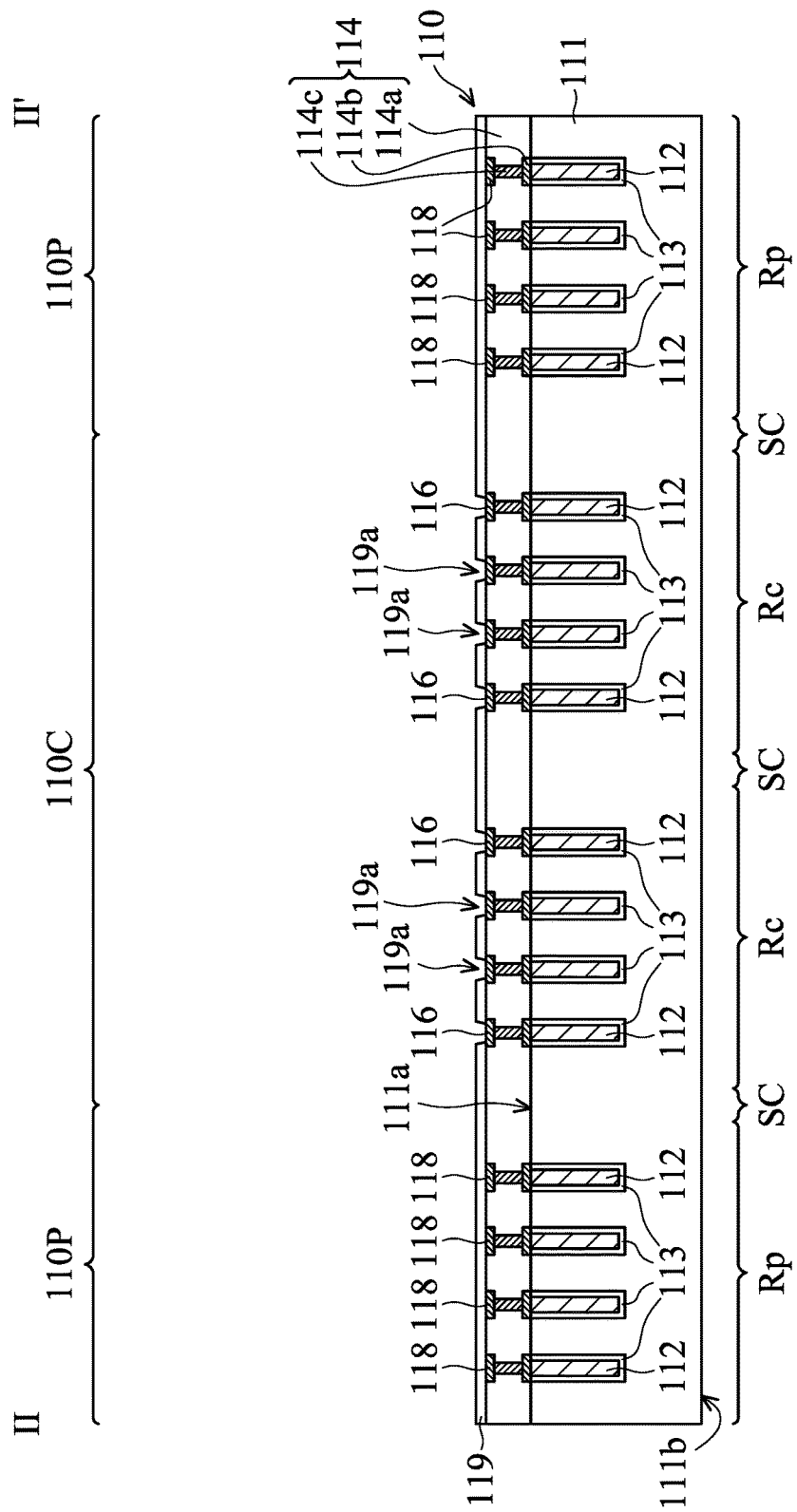
Figure 1B:
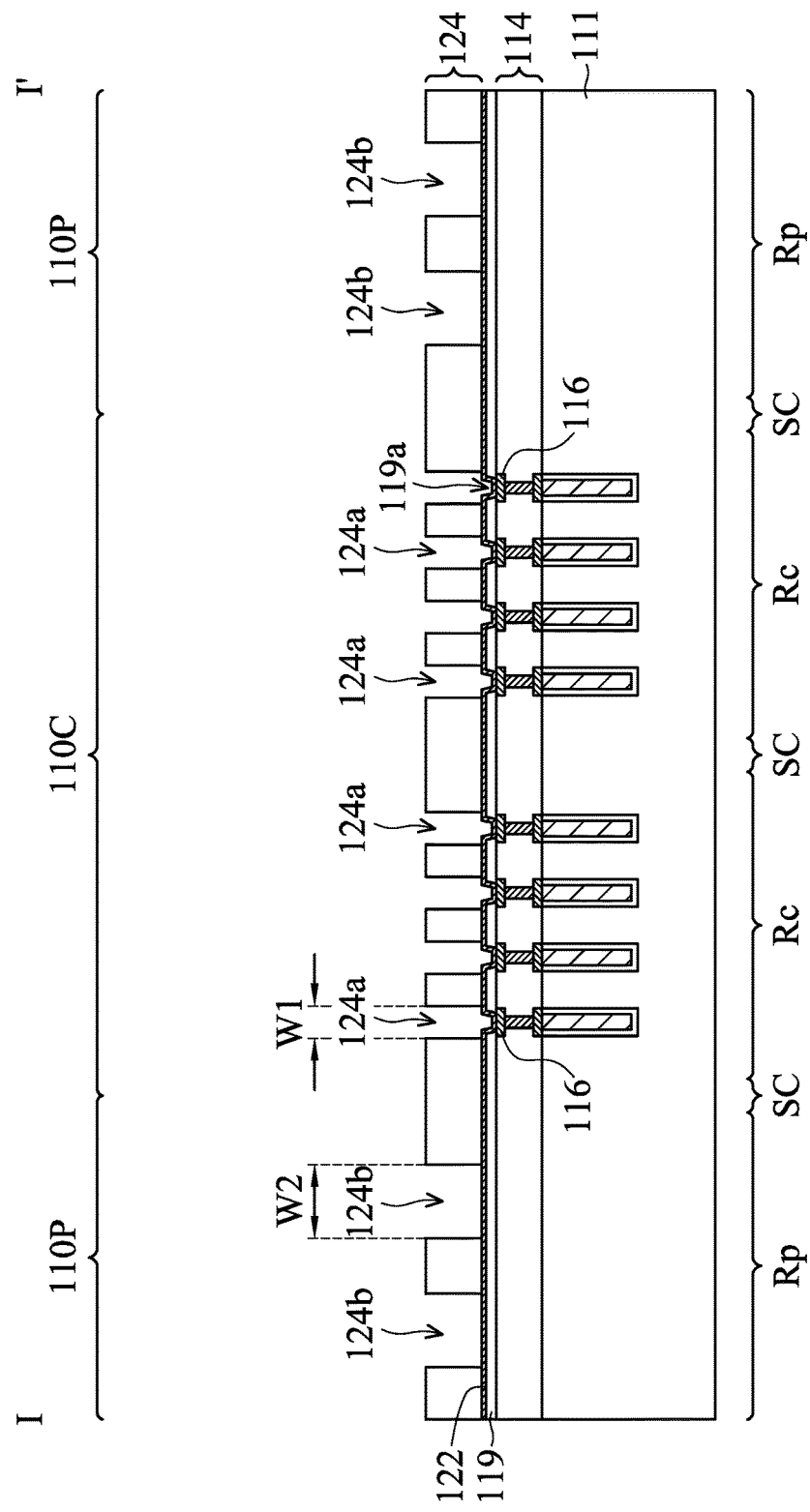
Figures 1, 1B:
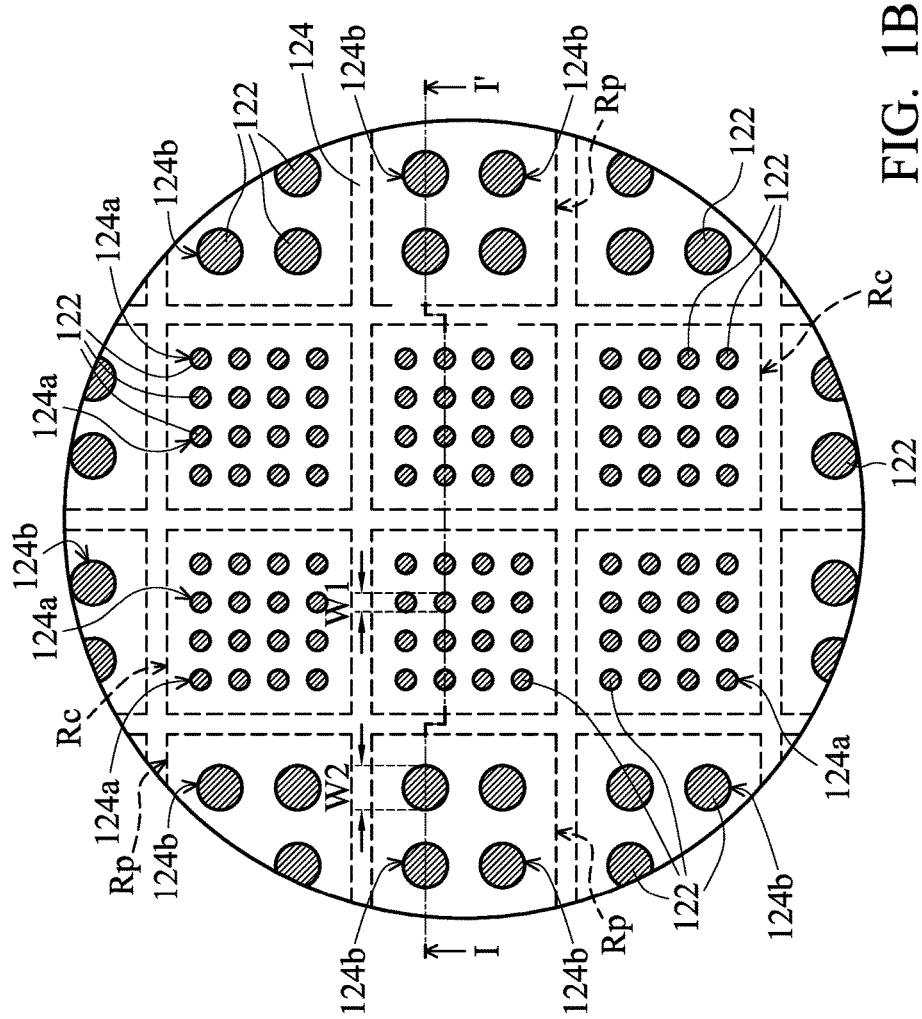
Figure 1C:
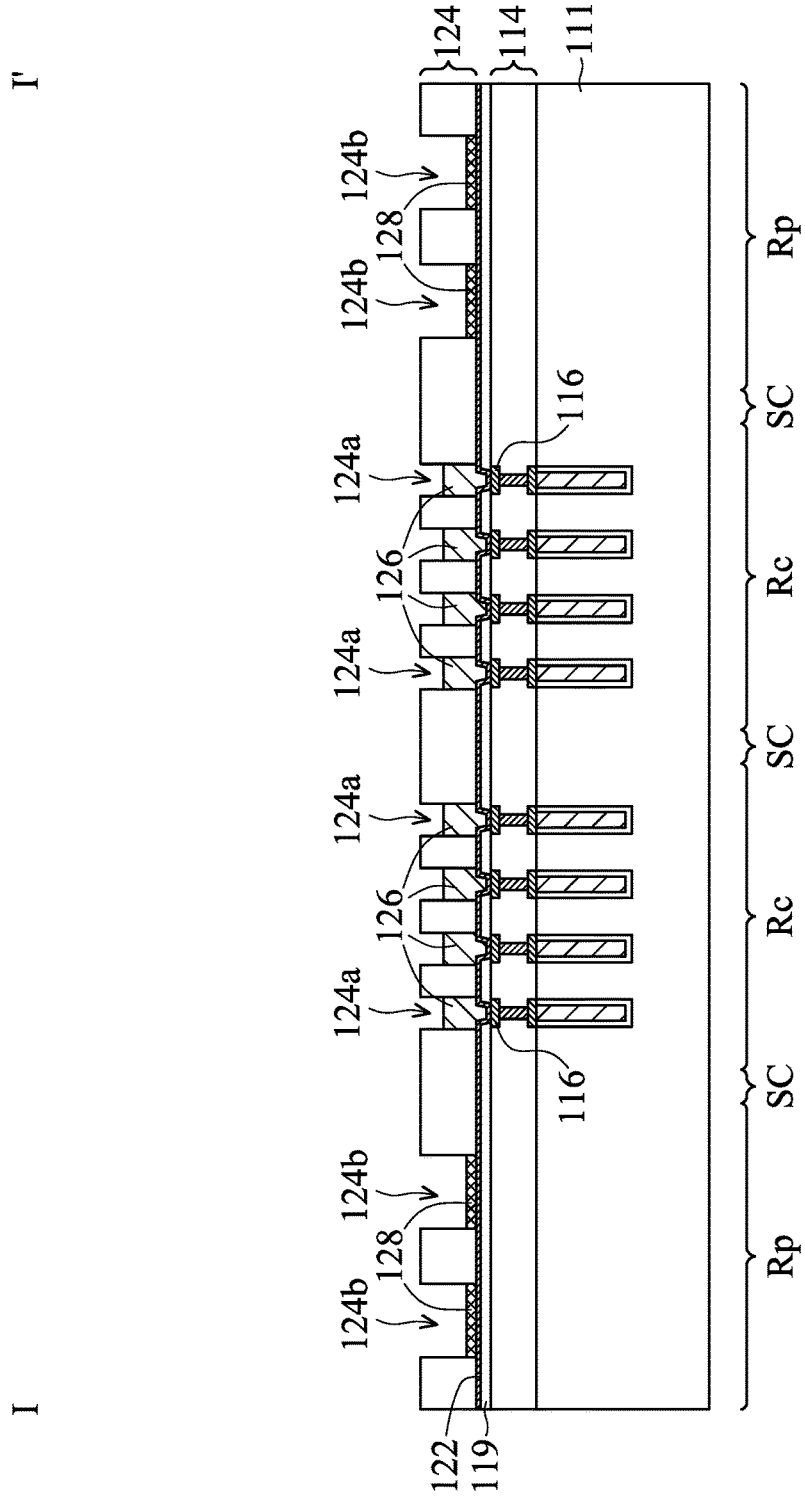
Figures 1, 1C:
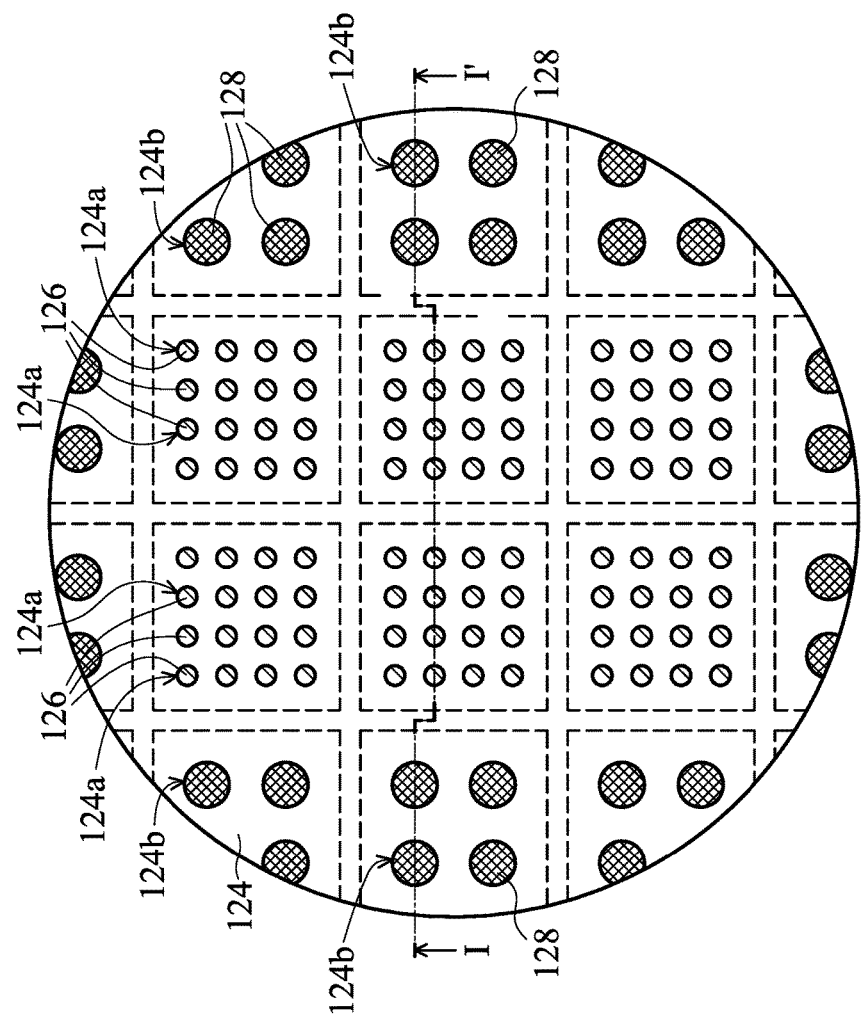
Figure 1D:
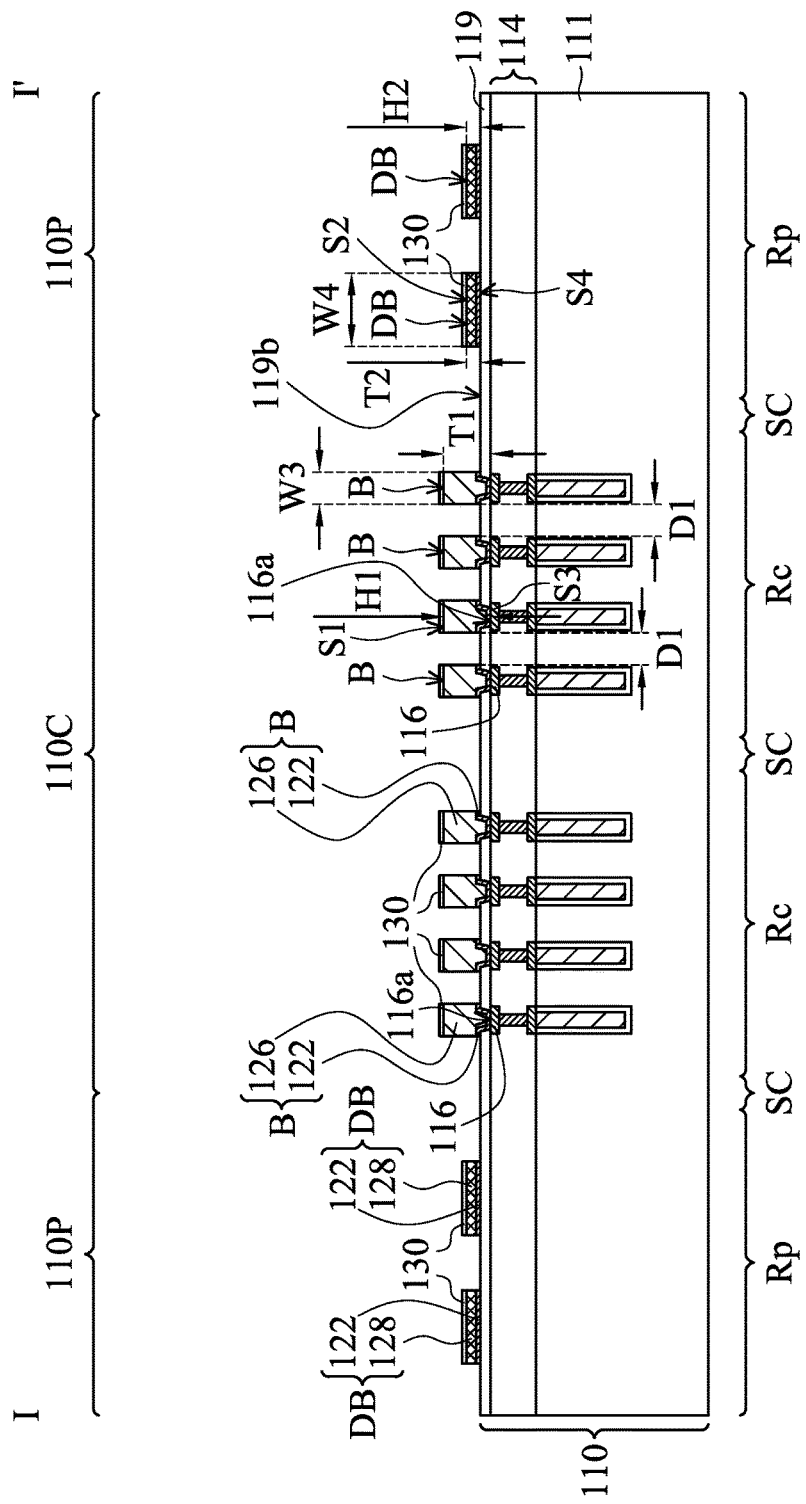
Figures 1, 1D:
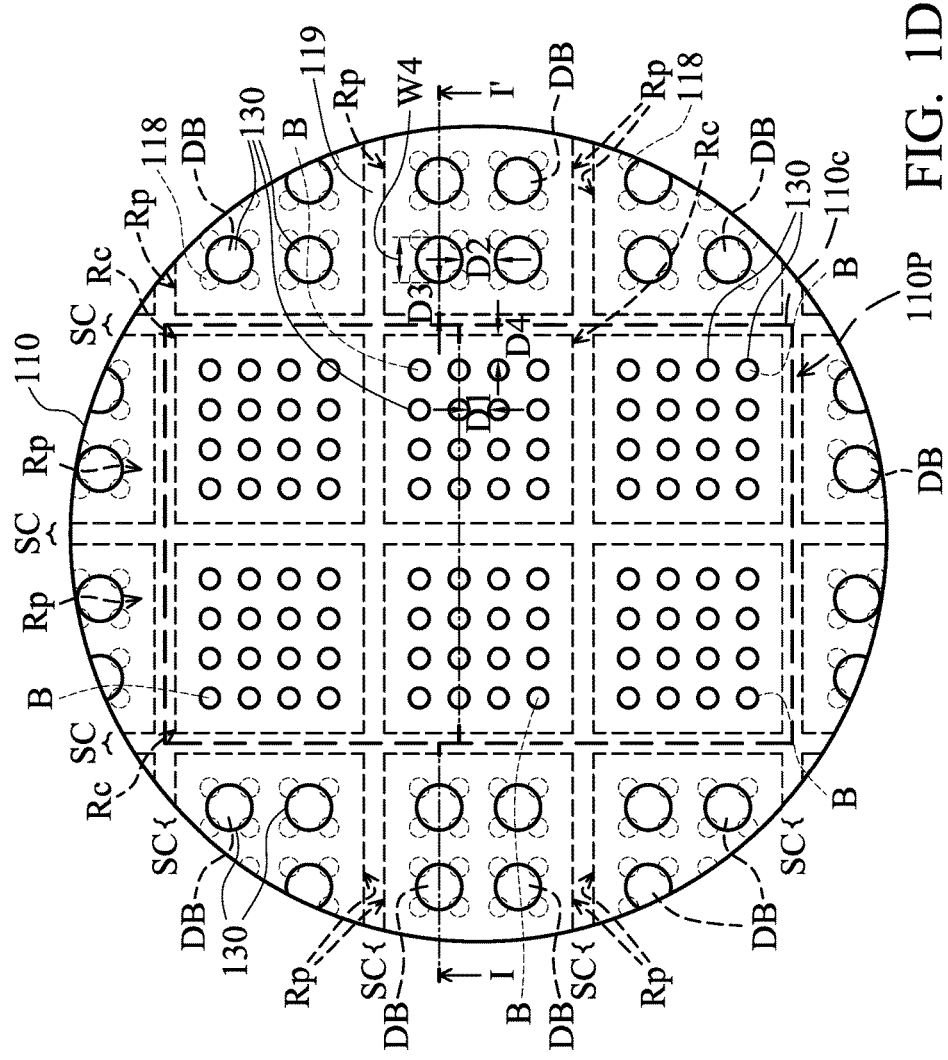

FIGS. 1A-1I are cross-sectional views of various stages of a process for forming a semiconductor device structure, in accordance with some embodiments. FIGS. 1A-1 to 1D-1 are top views of the semiconductor device structure of FIGS. 1A-1D, in accordance with some embodiments. FIGS. 1A-1D are cross-sectional views illustrating the semiconductor device structure along a sectional line I-I' in FIGS. 1A-1 to 1D-1, in accordance with some embodiments. FIG. 1A-2 is a cross-sectional view illustrating the semiconductor device structure along a sectional line II-II' in FIG. 1A-1, in accordance with some embodiments.

As shown in FIGS. 1A, 1A-1, and 1A-2, a semiconductor structure 110 is provided, in accordance with some embodiments. In some embodiments, the semiconductor structure 110 is a wafer. The semiconductor structure 110 includes a semiconductor substrate 111, conductive vias 112, a redistribution structure 114, first conductive pads 116, second conductive pads 118, and a dielectric layer 119, in accordance with some embodiments.

The semiconductor substrate 111 has surfaces 111a and 111b, in accordance with some embodiments. In some embodiments, the semiconductor substrate 111 is made of an elementary semiconductor material including silicon or germanium in a single crystal, polycrystal, or amorphous structure.

In some other embodiments, the semiconductor substrate 111 is made of a compound semiconductor (e.g., silicon carbide, gallium arsenide, gallium phosphide, indium phosphide, or indium arsenide), an alloy semiconductor (e.g., SiGe, or GaAsP), or a combination thereof. The semiconductor substrate 111 may also include multi-layer semiconductors, semiconductor on insulator (SOI) (such as silicon on insulator or germanium on insulator), or a combination thereof.

In some embodiments, the semiconductor structure 110 is an interposer wafer. The conductive vias 112 are formed in the semiconductor substrate 111, in accordance with some embodiments. The conductive vias 112 may be formed to extend from the surface 111a into the semiconductor substrate 111.

There is an insulating layer 113 formed between the conductive vias 112 and the semiconductor substrate 111, in accordance with some embodiments. The insulating layer 113 is configured to electrically insulate the conductive vias 112 from the semiconductor substrate 111, in accordance with some embodiments.

In some other embodiments, the semiconductor structure 110 is a device wafer that includes active devices or circuits. The active devices may include transistors (not shown) formed at the surface 111a. The semiconductor structure 110 may also include passive devices (not shown) formed in or over the semiconductor substrate 111, in accordance with some embodiments. The passive devices include resistors, capacitors, or other suitable passive devices.

The redistribution structure 114 is formed over the semiconductor substrate 111, in accordance with some embodiments. The first conductive pads 116 and the second conductive pads 118 are formed over the redistribution structure 114, in accordance with some embodiments.

The redistribution structure 114 includes a dielectric layer 114a, wiring layers 114b, and conductive vias 114c, in accordance with some embodiments. The dielectric layer 114a is formed over the surface 111a, in accordance with some embodiments. The wiring layers 114b are formed in the dielectric layer 114a, in accordance with some embodiments.

As shown in FIGS. 1A and 1A-2, the conductive vias 114c are electrically connected between different wiring layers 114b and between the wiring layer 114b, the first conductive pads 116, and the second conductive pads 118, in accordance with some embodiments. For the sake of simplicity, FIGS. 1A and 1A-2 only show one of the wiring layers 114b, in accordance with some embodiments. The conductive vias 112 are electrically connected to the first conductive pads 116 and the second conductive pads 118 respectively through the wiring layers 114b and the conductive vias 114c, in accordance with some embodiments.

The dielectric layer 119 is formed over the dielectric layer 114a, in accordance with some embodiments. The dielectric layer 119 covers the entire second conductive pads 118, in accordance with some embodiments. The dielectric layer 119 has openings 119a respectively exposing the first conductive pads 116, in accordance with some embodiments.

The semiconductor structure 110 has a central portion 110C and a peripheral portion 110P surrounding the central portion 110C, in accordance with some embodiments. The first conductive pads 116 are formed over the semiconductor substrate 111 of the central portion 110C, in accordance with some embodiments. The second conductive pads 118 are formed over the semiconductor substrate 111 of the peripheral portion 110P, in accordance with some embodiments.

As shown in FIGS. 1A and 1A-1, the semiconductor structure 110 has chip regions R, in accordance with some embodiments. In some embodiments, predetermined scribe lines SC are between the chip regions R. The chip regions R include central chip regions Rc and peripheral chip regions Rp, in accordance with some embodiments. The first conductive pads 116 are formed in the central chip regions Rc, in accordance with some embodiments. The second conductive pads 118 are formed in the peripheral chip regions Rp, in accordance with some embodiments.

As shown in FIGS. 1B and 1B-1, an under bump metallurgy (UBM) layer 122 is formed on the dielectric layer 119 and the first conductive pads 116, in accordance with some embodiments. The UBM layer 122 is in direct contact with the dielectric layer 119 and the first conductive pads 116, in accordance with some embodiments. The UBM layer 122 includes a diffusion barrier layer (not shown) and a seed layer (not shown), in accordance with some embodiments.

The seed layer is formed over the diffusion barrier layer, in accordance with some embodiments. The diffusion barrier layer may be a titanium layer, a titanium nitride layer, a tantalum layer, or a tantalum nitride layer. The materials of the seed layer may include copper or copper alloys. The materials of the seed layer may include other metals, such as silver, gold, aluminum, and combinations thereof. In some other embodiments, the diffusion barrier layer is not formed.

As shown in FIGS. 1B and 1B-1, a mask layer 124 is formed over the UBM layer 122, in accordance with some embodiments. The mask layer 124 has openings 124a and 124b, in accordance with some embodiments. The openings 124a are in the central chip regions Rc, in accordance with some embodiments. The openings 124a expose the UBM layer 122 over the first conductive pads 116, in accordance with some embodiments.

The openings 124b are in the peripheral chip regions Rp, in accordance with some embodiments. The openings 124b expose the UBM layer 122 in the peripheral chip regions Rp, in accordance with some embodiments. The opening 124a has a width W1, in accordance with some embodiments. The opening 124b has a width W2, in accordance with some embodiments. In some embodiments, the width W1 is equal to the average width of all of the openings 124a. In some embodiments, the width W2 is equal to the average width of all of the openings 124b.

The width W2 is greater than the width W1, in accordance with some embodiments. In some embodiments, a ratio of the width W2 to the width W1 ranges from about 2 to about 10. The ratio of the width W2 to the width W1 ranges from about 4 to about 6, in accordance with some embodiments. The width W1 ranges from about 20 μm to about 45 μm, in accordance with some embodiments. The width W2 ranges from about 100 μm to about 250 μm, in accordance with some embodiments. In some embodiments, an opening area of the opening 124b is greater than an opening area of the opening 124a. The mask layer 124 includes a polymer material, such a photoresist material, in accordance with some embodiments.

The openings 124a in one of the central chip regions Rc have a first total opening area, and the one of the central chip regions Rc has a first area. A first opening ratio of the mask layer 124 in the one of the central chip regions Rc is equal to a ratio of the first total opening area to the first area, in accordance with some embodiments.

The openings 124b in one of the peripheral chip regions Rp have a second total opening area, and the one of the peripheral chip regions Rp has a second area. A second opening ratio of the mask layer 124 in the one of the peripheral chip regions Rp is equal to a ratio of the second total opening area to the second area, in accordance with some embodiments.

The first opening ratio is close to or equal to the second opening ratio to improve the uniformity of the distribution of electric power lines during the subsequent electroplating process, in accordance with some embodiments. In some embodiments, a difference between the first opening ratio and the second opening ratio ranges from about −0.1 to about 0.1.

As shown in FIGS. 1C and 1C-1, a conductive layer 126 is formed in the openings 124a, and a conductive layer 128 is formed in the openings 124b, in accordance with some embodiments. The conductive layer 126 is thicker than the conductive layer 128, in accordance with some embodiments. The conductive layers 126 and 128 include copper or another suitable conductive material.

The conductive layers 126 and 128 are made of the same material, in accordance with some embodiments. The formation of the conductive layers 126 and 128 includes performing an electroplating process or another suitable process. The conductive layers 126 and 128 are formed in the same process (e.g. the same electroplating process), in accordance with some embodiments. The conductive layers 126 and 128 are formed at the same time, in accordance with some embodiments.

As shown in FIGS. 1D and 1D-1, the mask layer 124 and the UBM layer 122 under the mask layer 124 are removed, in accordance with some embodiments. After the removal process, the conductive layer 126 and the UBM layer 122 thereunder together form conductive bumps B, in accordance with some embodiments.

The conductive bumps B are formed on top surfaces 116a of the first conductive pads 116, in accordance with some embodiments. The conductive bumps B are electrically connected to the first conductive pads 116, in accordance with some embodiments. The conductive bumps B are in direct contact with the first conductive pads 116, in accordance with some embodiments.

The conductive layer 128 and the UBM layer 122 thereunder together form dummy conductive bumps DB, in accordance with some embodiments. The dummy conductive bumps DB surround the conductive bumps B, in accordance with some embodiments. The entire dummy conductive bumps DB are formed on a top surface 119b of the dielectric layer 119, in accordance with some embodiments.

The dummy conductive bumps DB are in direct contact with the dielectric layer 119, in accordance with some embodiments. The dummy conductive bumps DB are electrically insulated to the second conductive pads 118 thereunder by the dielectric layer 119, in accordance with some embodiments.

Each of the conductive bumps B has a thickness T1 and a width W3, in accordance with some embodiments. Each of the dummy conductive bumps DB has a thickness T2 and a width W4, in accordance with some embodiments. The width W4 is greater than the width W3, in accordance with some embodiments. In some embodiments, a ratio of the width W4 to the width W3 ranges from about 2 to about 10. The ratio of the width W4 to the width W3 ranges from about 4 to about 6, in accordance with some embodiments.

The width W3 ranges from about 20 $\mu$m to about 45 $\mu$m, in accordance with some embodiments. The width W4 ranges from about 100 $\mu$m to about 250 $\mu$m, in accordance with some embodiments.

The thickness T2 is less than the thickness T1, in accordance with some embodiments. In some embodiments, a ratio of the thickness T1 to the thickness T2 ranges from about 5 to about 15. The thickness T1 ranges from about 25 $\mu$m to about 40 $\mu$m, in accordance with some embodiments. The thickness T2 ranges from about 2 $\mu$m to about 20 $\mu$m, in accordance with some embodiments. The thickness T2 ranges from about 2 $\mu$m to about 5 $\mu$m, in accordance with some embodiments.

In some embodiments, the thicknesses T1 and T2 are respectively the maximum thicknesses of the conductive bump B and the dummy conductive bump DB. In some embodiments, the widths W3 and W4 are respectively the maximum widths of the conductive bump B and the dummy conductive bump DB.

In some embodiments, a top surface S1 of the conductive bump B has a height H1 with respect to the top surface 116a of the first conductive pad 116. The height H1 is equal to a distance between the top surfaces S1 and 116a, in accordance with some embodiments.

In some embodiments, a top surface S2 of the dummy conductive bump DB has a height H2 with respect to the top surface 119b of the dielectric layer 119. The height H2 is equal to a distance between the top surfaces S2 and 119b, in accordance with some embodiments. The height H2 is less than the height H1, in accordance with some embodiments. That is, the top surfaces S1 and S2 are not coplanar, in accordance with some embodiments. Furthermore, a bottom surface S3 of the conductive bump B and a bottom surface S4 of the dummy conductive bump DB are not coplanar, in accordance with some embodiments.

The height H1 ranges from about 25 $\mu$m to about 40 $\mu$m, in accordance with some embodiments. The height H2 ranges from about 2 $\mu$m to about 20 $\mu$m, in accordance with some embodiments. The height H2 ranges from about 2 $\mu$m to about 5 $\mu$m, in accordance with some embodiments.

In some embodiments, a contact area between the dummy conductive bump DB and the semiconductor structure 110 is greater than a contact area between the conductive bump B and the semiconductor structure 110. The large contact area between the dummy conductive bump DB and the semiconductor structure 110 may improve the adhesive force between the dummy conductive bump DB and the semiconductor structure 110.

Therefore, the dummy conductive bumps DB with the large contact area and the less height H2 are prevented from falling from the dielectric layer 119 during the subsequent processes, in accordance with some embodiments. As a result, the yield is improved, in accordance with some embodiments.

The conductive bumps B are formed over the central portion 110C and electrically connected to the semiconductor structure 110, in accordance with some embodiments. The dummy conductive bumps DB are over the peripheral portion 110P and electrically insulated from the semiconductor structure 110, in accordance with some embodiments.

The conductive bumps B are in the central chip regions Rc, in accordance with some embodiments. The dummy conductive bumps DB are in the peripheral chip regions Rp, in accordance with some embodiments. In some embodiments, the number of dummy conductive bumps DB in one of the peripheral chip regions Rp is less than the number of conductive bumps B in one of the central chip regions Rc.

As shown in FIG. 1D-1, in some embodiments, a minimum distance D2 between two adjacent dummy conductive bumps DB in one of the peripheral chip regions Rp is greater than a minimum distance D1 between two adjacent conductive bumps B in one of the central chip regions Rc.

The minimum distance D1 is greater than 25 $\mu$m, in accordance with some embodiments. The minimum distance D1 ranges from about 25 $\mu$m to about 200 $\mu$m, in accordance with some embodiments. The minimum distance D2 is greater than 100 $\mu$m, in accordance with some embodiments. The minimum distance D2 ranges from about 100 $\mu$m to about 300 $\mu$m, in accordance with some embodiments. In some embodiments, the width W4 of the dummy conductive bump DB is greater than the distance D1 between two adjacent conductive bumps B.

In some embodiments, a top surface area of the dummy conductive bump DB is greater than a top surface area of the conductive bump B. In some embodiments, a total top surface area of the conductive bumps B in one of the central chip regions Rc is greater than a total top surface area of the dummy conductive bumps DB in one of the peripheral chip regions Rp.

As shown in FIGS. 1D and 1D-1, a solder layer 130 is formed over the top surfaces S1 of the conductive bumps B and the top surfaces S2 of the dummy conductive bumps DB, in accordance with some embodiments. The solder layer 130 is in direct contact with the conductive bumps B and the dummy conductive bumps DB, in accordance with some embodiments.

The solder layer 130 may be a lead-free pre-solder layer formed of, for example, SnAg, or a solder material layer, including alloys of tin, lead, silver, copper, nickel, bismuth, or a combination thereof. In some embodiments, a flux layer (not shown) is formed over the solder layer 130 and the conductive bumps B to reduce the melting point of the solder layer 130.

In some embodiments, a minimum distance D3 between the dummy conductive bump DB and the predetermined scribe line SC is greater than a minimum distance D4 between the conductive bump B and the predetermined scribe line SC. The minimum distance D3 ranges from about 70 μm to about 150 μm, in accordance with some embodiments. The minimum distance D4 ranges from about 100 μm to about 200 μm, in accordance with some embodiments.

Figure 3:
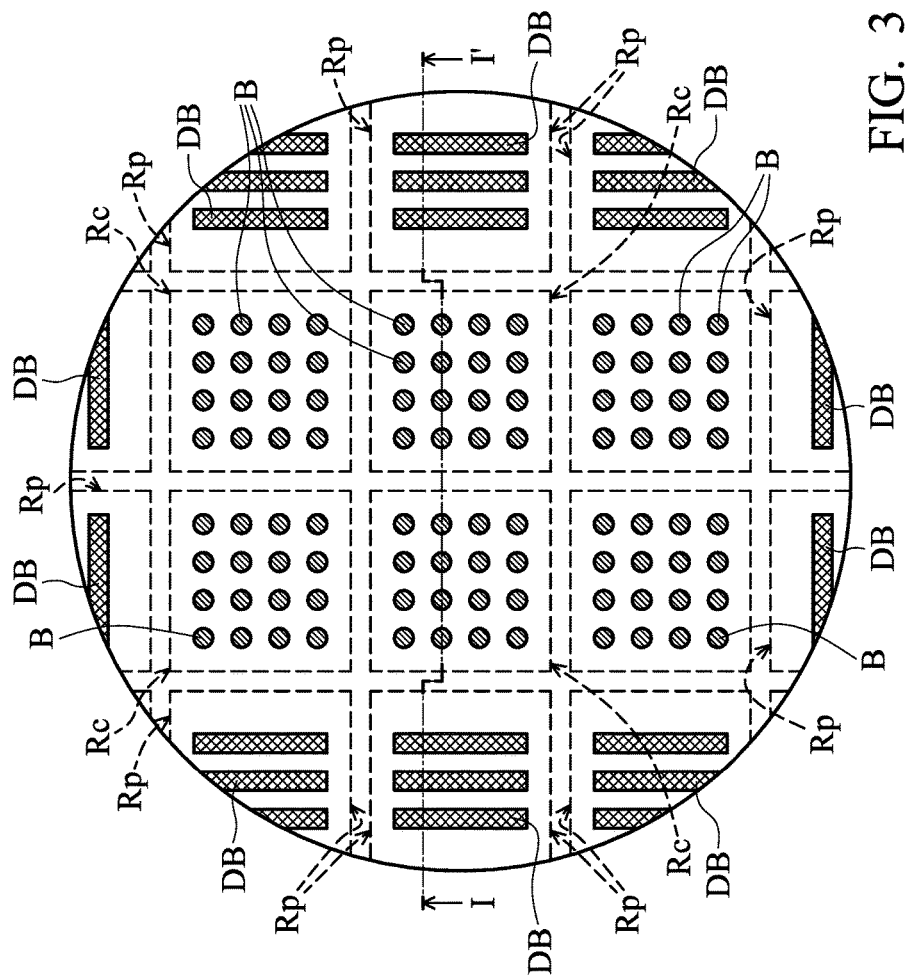
FIG. 3 is a top view of a semiconductor device structure, in accordance with some embodiments.

The dummy conductive bumps DB are in a round shape, a ring shape (as shown in FIG. 2), or a strip shape (as shown in FIG. 3), or another suitable shape. For the sake of simplicity, FIGS. 2-3 do not show the solder layer 130. As shown in FIG. 2, only one dummy conductive bump DB is formed in one of the peripheral chip regions Rp, in accordance with some embodiments.

Figure 1E:
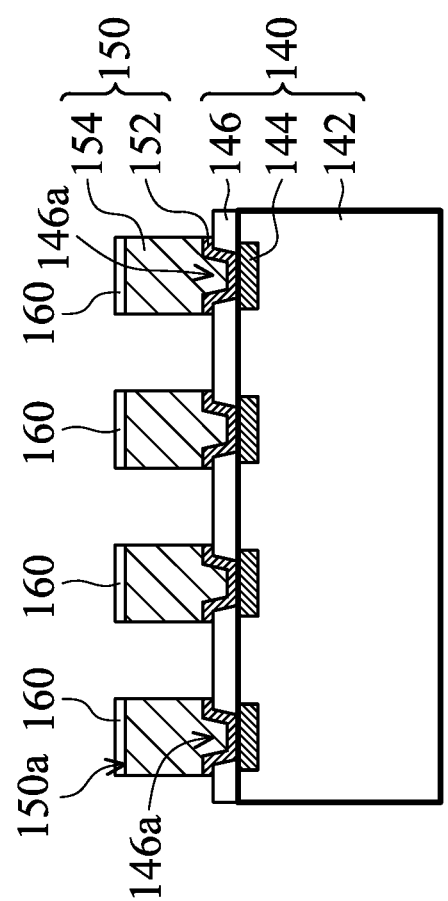

As shown in FIG. 1E, chips 140 are provided, in accordance with some embodiments. For the sake of simplicity, FIG. 1E only shows one of the chips 140, in accordance with some embodiments. The chip 140 includes a semiconductor substrate 142, conductive pads 144, and a dielectric layer 146, in accordance with some embodiments.

The conductive pads 144 are formed over the semiconductor substrate 142, in accordance with some embodiments. The dielectric layer 146 is formed over the semiconductor substrate 142, in accordance with some embodiments. The dielectric layer 146 has openings 146a exposing the conductive pads 144 thereunder, in accordance with some embodiments.

As shown in FIG. 1E, conductive bumps 150 are formed on the conductive pads 144, in accordance with some embodiments. The conductive bump 150 includes an under bump metallurgy (UBM) layer 152 and a conductive layer 154, in accordance with some embodiments. The conductive layer 154 is formed over the UBM layer 152, in accordance with some embodiments.

The UBM layer 152 may include a diffusion barrier layer (not shown) and a seed layer (not shown) thereon, in accordance with some embodiments. The diffusion barrier layer may be a titanium layer, a titanium nitride layer, a tantalum layer, or a tantalum nitride layer.

The materials of the seed layer may include copper or copper alloys. The materials of the seed layer may include other metals, such as silver, gold, aluminum, and combinations thereof. In some other embodiments, the diffusion barrier layer is not formed. The conductive layer 154 includes copper or another suitable conductive material.

As shown in FIG. 1E, a solder layer 160 is formed over top surfaces 150a of the conductive bumps 150, in accordance with some embodiments. The solder layer 160 may be a lead-free pre-solder layer formed of, for example, SnAg, or a solder material, including alloys of tin, lead, silver, copper, nickel, bismuth, or a combination thereof. In some embodiments, a flux layer (not shown) is formed over the solder layer 160 and the conductive bumps 150 to reduce the melting point of the solder layer 160.

Figure 1F:
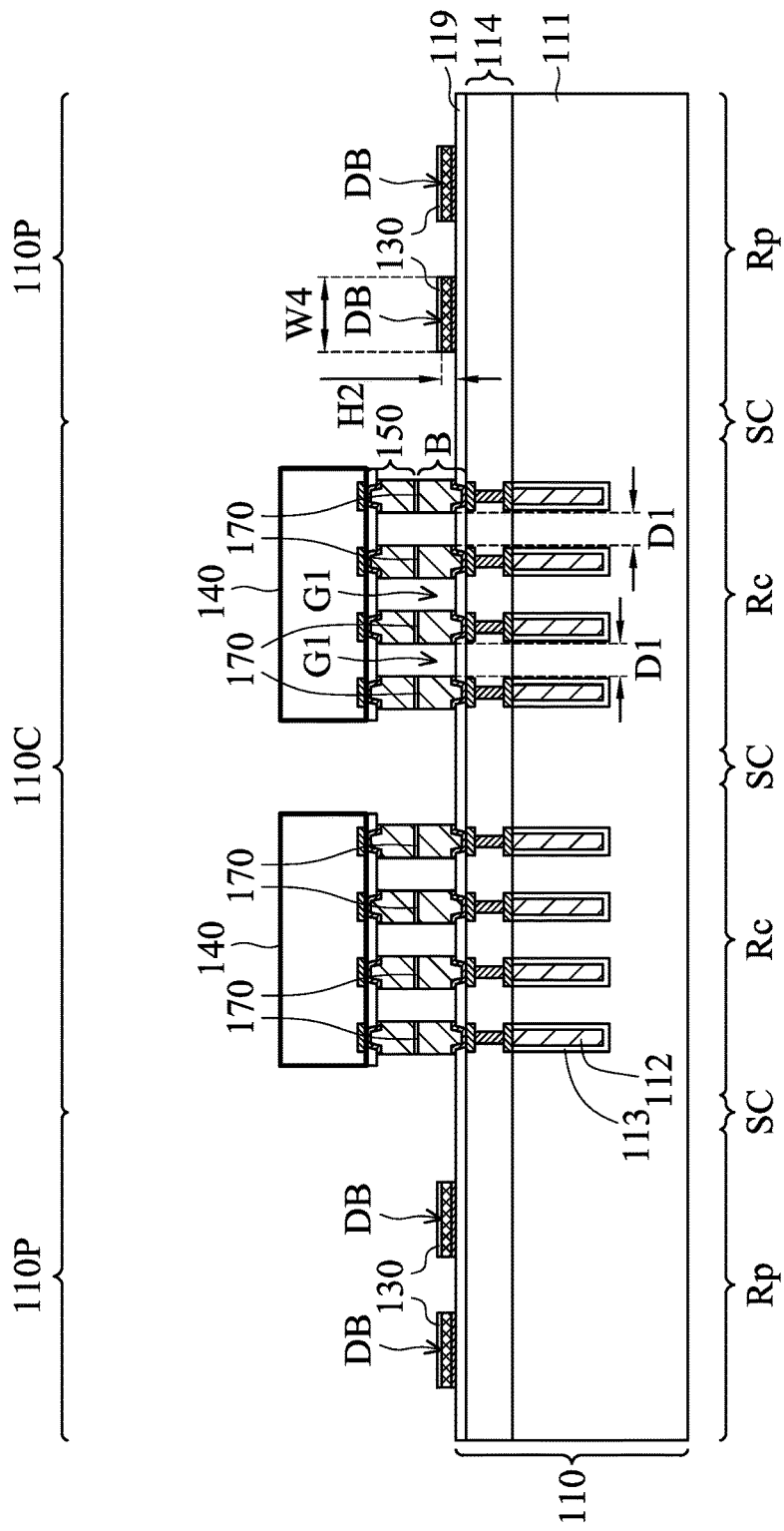

As shown in FIG. 1F, the chips 140 are flipped upside down to be bonded to the semiconductor structure 110 through the conductive bumps 150 and B between the chips 140 and the semiconductor structure 110, in accordance with some embodiments. The bonding process includes bonding the solder layer 160 to the solder layer 130; and reflowing the solder layers 130 and 160 to form a solder layer 170 between the conductive bumps 150 and B, in accordance with some embodiments.

After the reflow process, a cleaning process (or a washing process) is performed over the chips 140 and the semiconductor structure 110 to remove the flux, in accordance with some embodiments. Since the dummy conductive bumps DB have the large contact area (between the dummy conductive bump DB and the semiconductor structure 110) and the less height H2, the dummy conductive bumps DB may remain after the cleaning process. Therefore, the yield of the cleaning process is improved, in accordance with some embodiments.

Furthermore, since the width W4 of the dummy conductive bump DB is greater than the distance D1 between two adjacent conductive bumps B, even if the dummy conductive bump DB falls from the dielectric layer 119, the dummy conductive bump DB does not fall into gaps G1 between the conductive bumps B, in accordance with some embodiments.

Figure 1G:
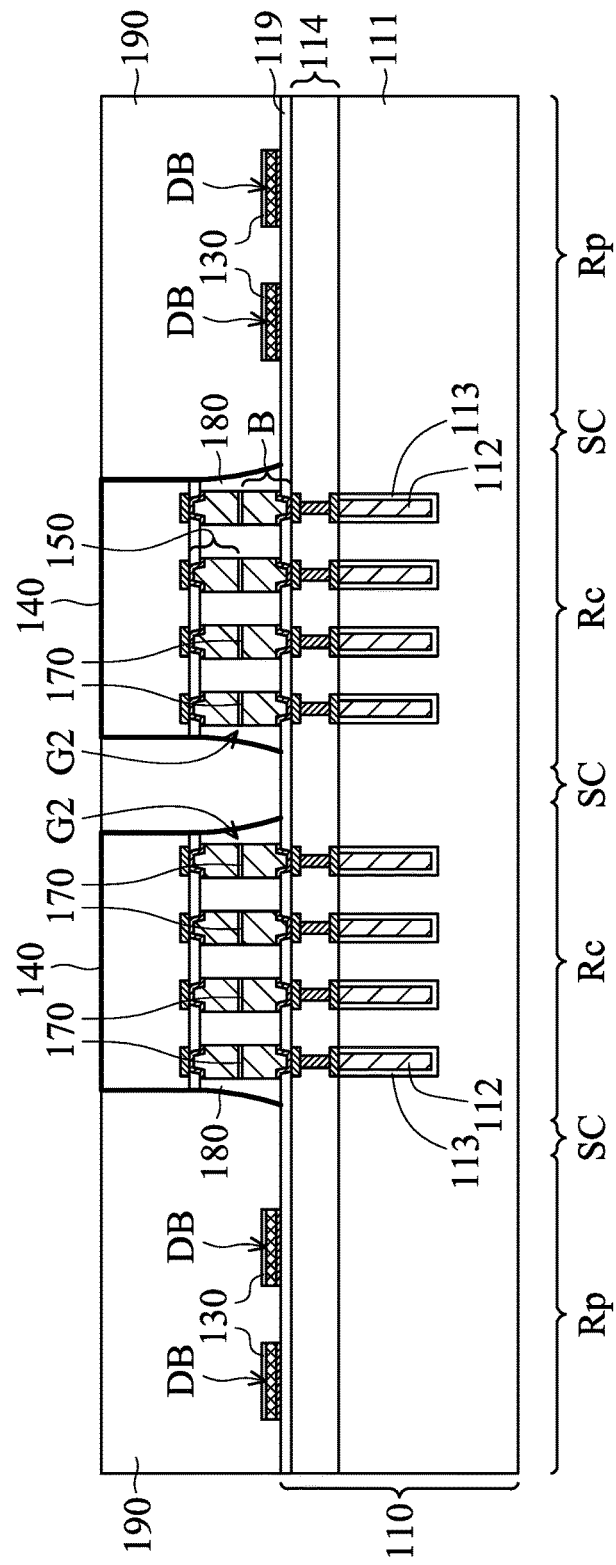

As shown in FIG. 1G, an underfill layer 180 is formed into a gap G2 between the semiconductor structure 110 and each of the chips 140, in accordance with some embodiments. The underfill layer 180 includes a polymer material, in accordance with some embodiments As shown in FIG. 1G, a molding layer 190 is formed over the semiconductor structure 110 to surround the chips 140 and the conductive bumps B and 150, in accordance with some embodiments. The molding layer 190 includes a polymer material, in accordance with some embodiments.

Figure 1H:
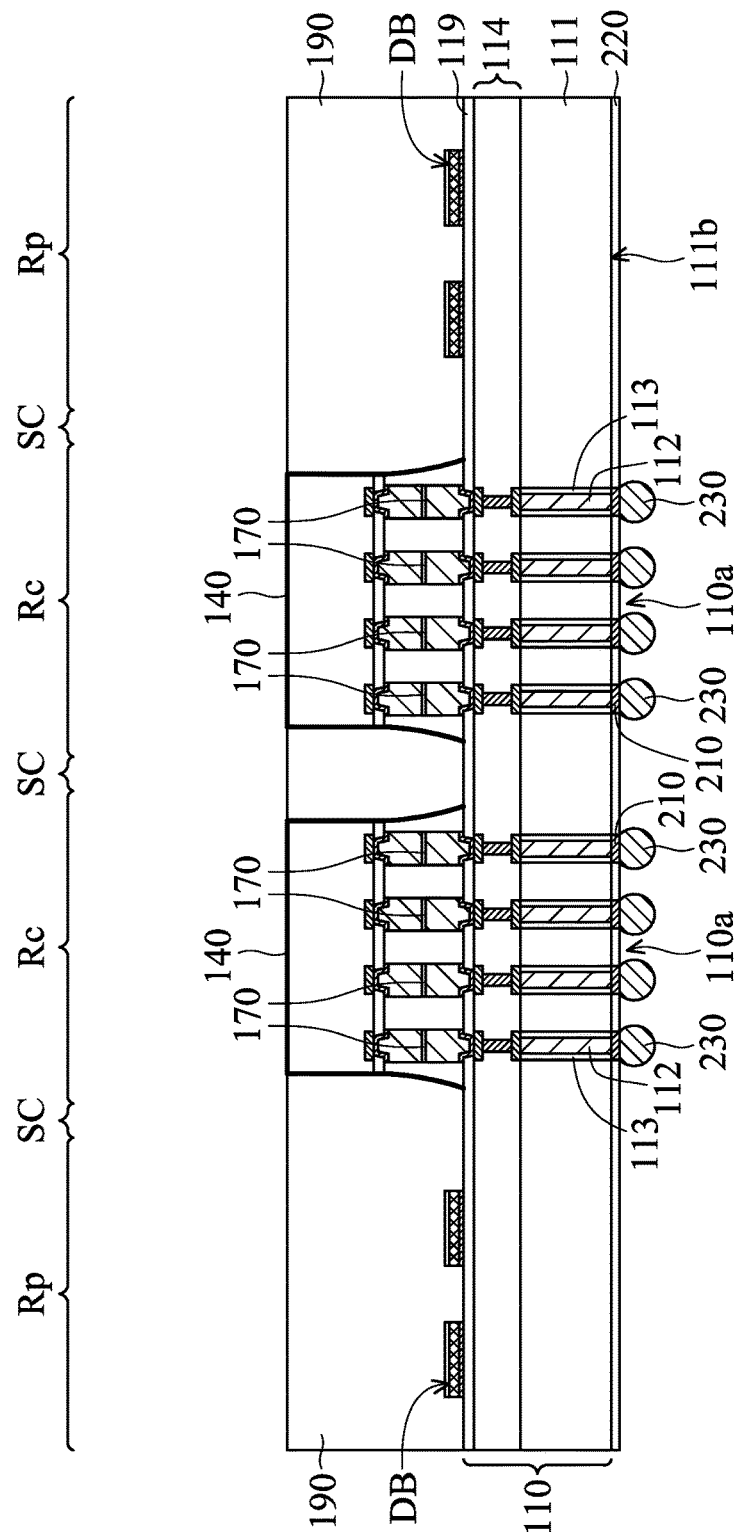

As shown in FIG. 1H, a lower portion of the semiconductor substrate 111 is removed, in accordance with some embodiments. The removal process includes a chemical mechanical polishing process, in accordance with some embodiments.

After the removal process, the conductive vias 112 and the insulating layer 113 are exposed, in accordance with some embodiments. The conductive vias 112 and the insulating layer 113 pass through the semiconductor substrate 111, in accordance with some embodiments. The conductive vias 112 are also referred to as through-substrate vias or through-silicon vias when the semiconductor substrate 111 is a silicon substrate, in accordance with some embodiments.

As shown in FIG. 1H, conductive pads 210 are formed over the conductive vias 112, in accordance with some embodiments. As shown in FIG. 1H, a dielectric layer 220 is formed over the surface 111b of the semiconductor substrate 111, in accordance with some embodiments. As shown in FIG. 1H, conductive bumps 230 are formed over the conductive pads 210, in accordance with some embodiments. The conductive bumps 230 include tin, copper, or another suitable conductive material.

Figure 1I:
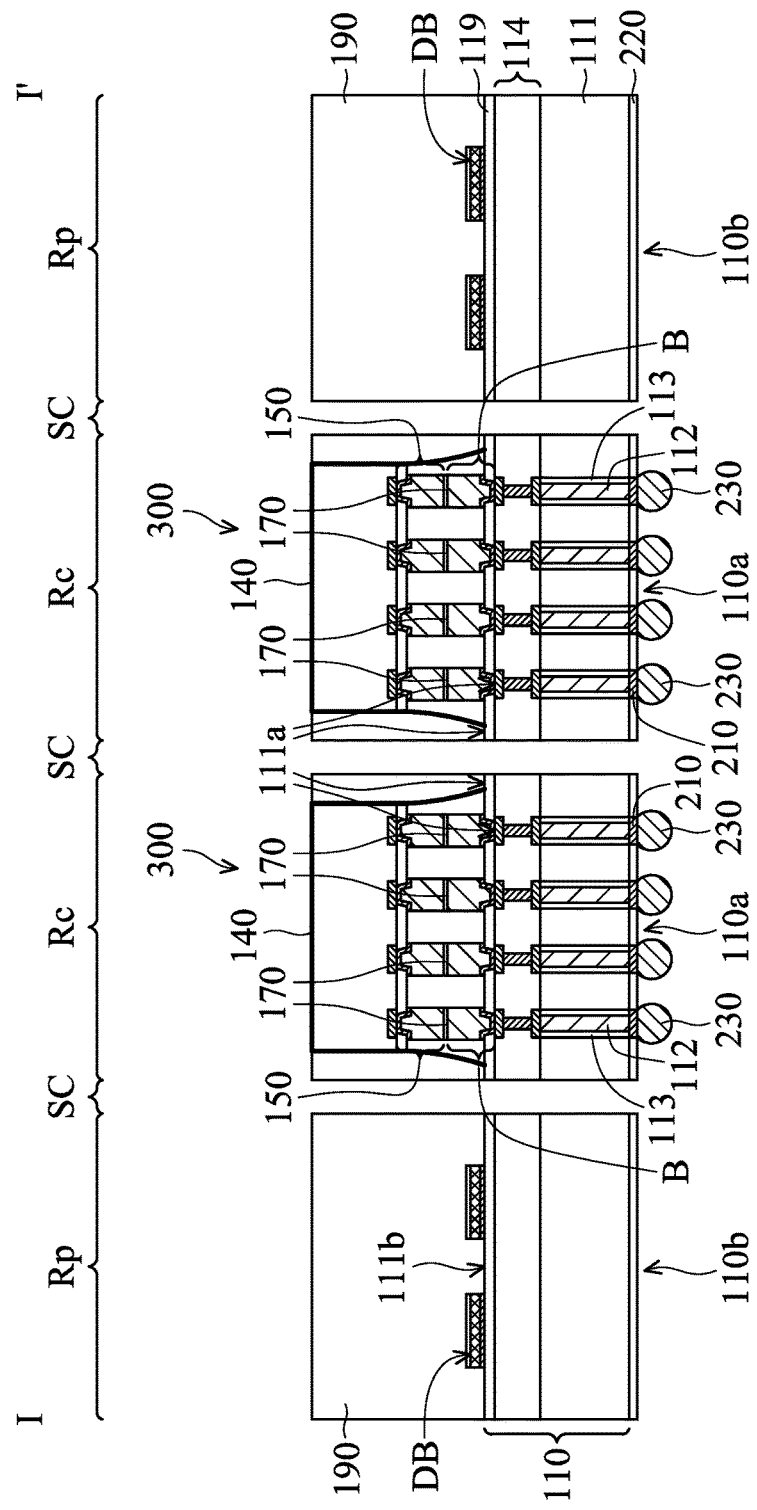
Figures 1, 1I:
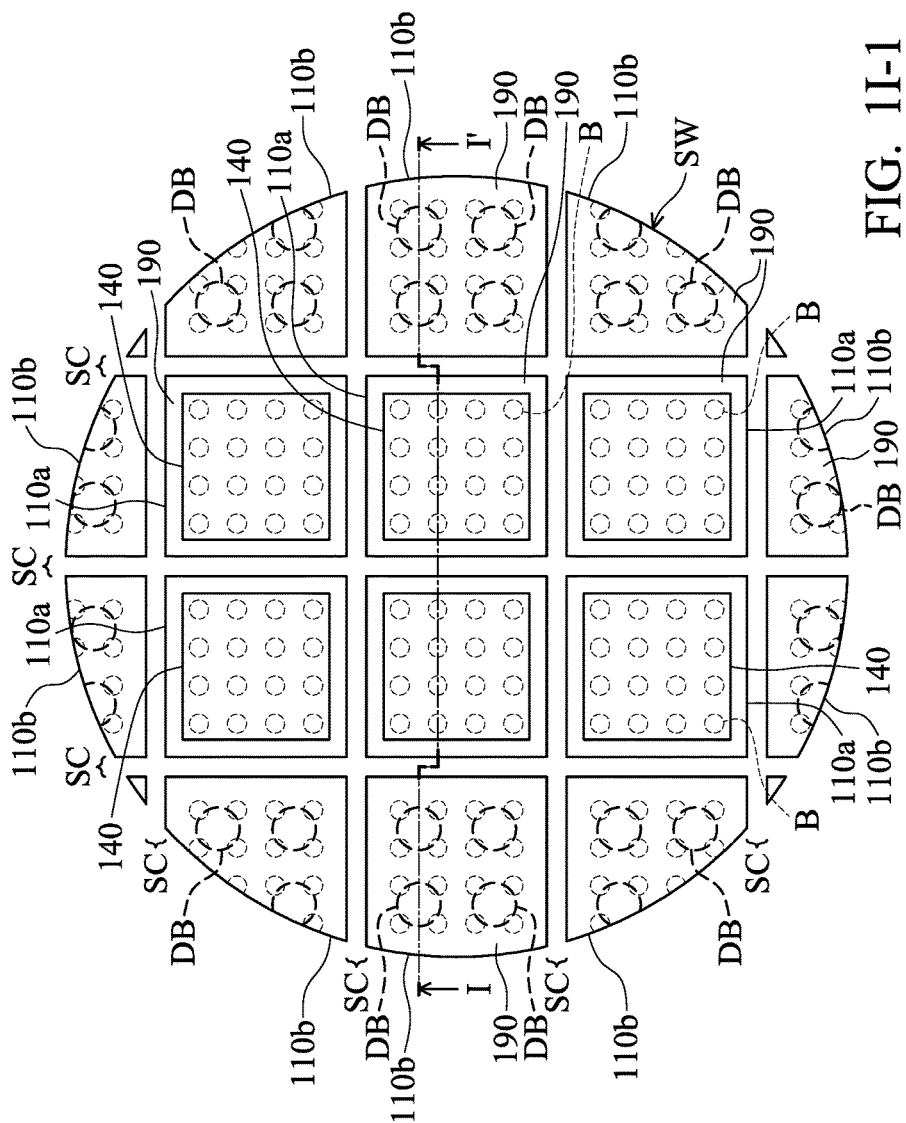
Figure 2:
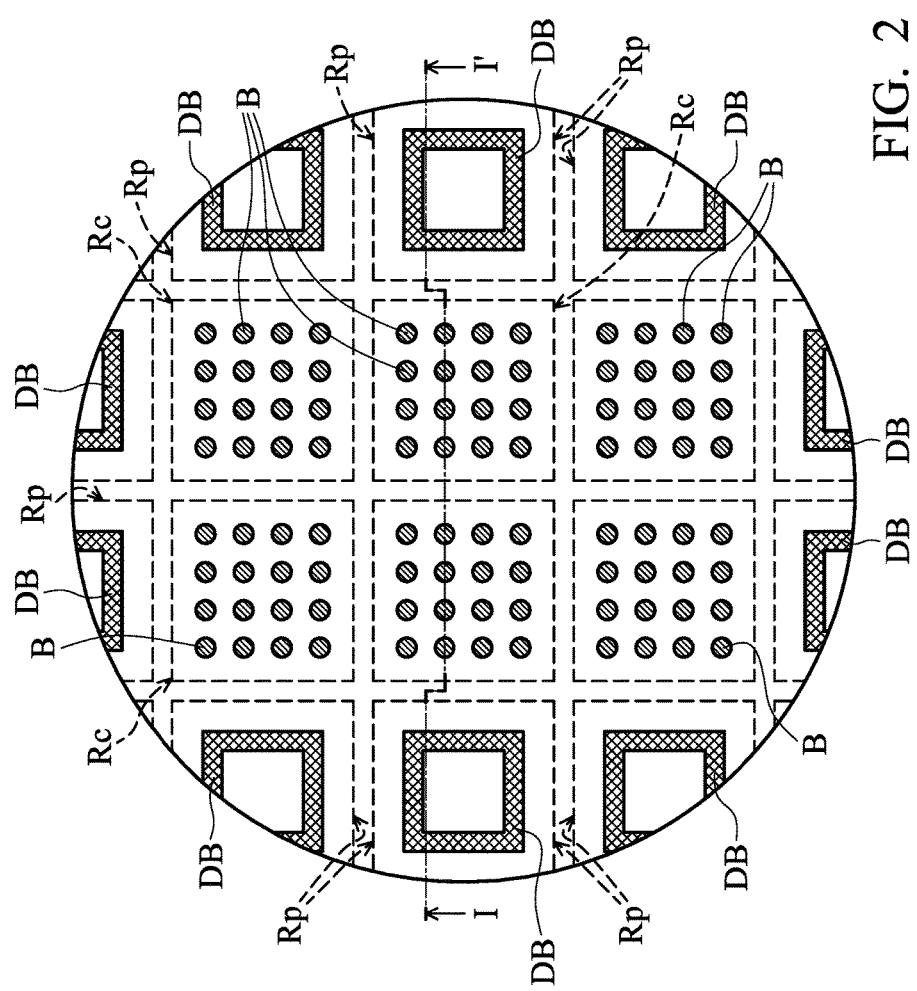

FIG. 1I-1 is a top view of the semiconductor device structure of FIG. 1I, in accordance with some embodiments. As shown in FIGS. 1I and 1I-1, a cutting process is performed to cut through the dielectric layer 220, the semiconductor structure 110, and the molding layer 190 along the predetermined scribe lines SC to form chip packages 300, in accordance with some embodiments.

After the cutting process, the semiconductor structure 110 is cut into individual central chips 110a and peripheral chips 110b, in accordance with some embodiments. Each of the chip packages 300 includes one of the central chips 110a, one of the chips 140, the conductive bumps 150 and B therebetween, and the solder layer 170, in accordance with some embodiments.

In the chip package 300, the conductive bumps B over a top surface 111a of the central chip 110a have a first total top surface area, in accordance with some embodiments. The central chip 110a has a first top surface area, in accordance with some embodiments. The dummy conductive bumps DB over a top surface 111b of the peripheral chip 110b have a second total top surface area, in accordance with some embodiments. The peripheral chip 110b has a second top surface area, in accordance with some embodiments.

In some embodiments, a first ratio of the first total top surface area to the first top surface area is closed to or equal to a second ratio of the second total top surface area to the second top surface area. In some embodiments, a difference between the first ratio of the first total top surface area to the first top surface area and the second ratio of the second total top surface area to the second top surface area ranges from about −0.1 to about 0.1. The peripheral chip 110b has a curved sidewall SW, in accordance with some embodiments.

In accordance with some embodiments, methods for forming semiconductor device structures are provided. The methods (for forming the semiconductor device structure) form conductive bumps and dummy conductive bumps over a central portion and a peripheral portion of a wafer respectively. The dummy conductive bump has a larger contact area (between the dummy conductive bump and the wafer) and a less height than that of the conductive bump. Therefore, the dummy conductive bumps are prevented from falling from the wafer during the subsequent processes. As a result, the yield is improved.

In accordance with some embodiments, a method for forming a semiconductor device structure is provided. The method includes providing a semiconductor structure. The semiconductor structure has a central portion and a peripheral portion surrounding the central portion. The method includes forming first conductive bumps and dummy conductive bumps over a surface of the semiconductor structure. The first conductive bumps are over the central portion and electrically connected to the semiconductor structure. The dummy conductive bumps are over the peripheral portion and electrically insulated from the semiconductor structure. The first conductive bumps each have a first thickness and a first width. The dummy conductive bumps each have a second thickness and a second width. The second thickness is less than the first thickness. The second width is greater than the first width.

In accordance with some embodiments, a method for forming a semiconductor device structure is provided. The method includes providing a semiconductor structure. The semiconductor structure has a central portion and a peripheral portion surrounding the central portion. The method includes forming first conductive bumps and dummy conductive bumps on a surface of the semiconductor structure. The first conductive bumps are over the central portion and electrically connected to the semiconductor structure. The dummy conductive bumps are over the peripheral portion and electrically insulated from the semiconductor structure. The first conductive bumps each have a first thickness. The dummy conductive bumps each have a second thickness. The second thickness is less than the first thickness, and a contact area between the dummy conductive bump and the semiconductor structure is greater than a contact area between the first conductive bump and the semiconductor structure.

In accordance with some embodiments, a method for forming a semiconductor device structure is provided. The method includes providing a semiconductor structure. The semiconductor structure has a central portion and a peripheral portion surrounding the central portion. The method includes forming first conductive bumps and dummy conductive bumps over a surface of the semiconductor structure. The first conductive bumps are over the central portion and electrically connected to the semiconductor structure. The dummy conductive bumps are over the peripheral portion and electrically insulated from the semiconductor structure. The first conductive bumps each have a first thickness. The dummy conductive bumps each have a second thickness. The second thickness is less than the first thickness, and a width of the dummy conductive bump is greater than a distance between two adjacent first conductive bumps.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   providing a semiconductor structure, wherein the semiconductor structure has a central portion and a peripheral portion surrounding the central portion, the semiconductor structure is a wafer, the semiconductor structure comprises a plurality of chip regions, a plurality of predetermined scribe lines are between the chip regions, and the chip regions comprise central chip regions and peripheral chip regions; and
   forming a plurality of first conductive bumps and a plurality of dummy conductive bumps over a surface of the semiconductor structure,
   wherein the first conductive bumps are over the central portion and electrically connected to the semiconductor structure, the dummy conductive bumps are over the peripheral portion and electrically insulated from the semiconductor structure, the first conductive bumps each having a first thickness and a first width, the dummy conductive bumps each having a second thickness and a second width, the second thickness is less than the first thickness, the second width is greater than the first width, the first conductive bumps are in the central chip regions, and the dummy conductive bumps are in the peripheral chip regions;
   forming a plurality of second conductive bumps over chips;
   bonding the chips to the semiconductor structure through the second conductive bumps and the first conductive bumps between the chips and the semiconductor structure; and cutting the semiconductor structure into individual central chips and peripheral chips along the predetermined scribe lines to produce chip packages, each of the chip packages comprises one of the central chips, one of the chips, the second conductive bumps, and the first conductive bumps between the one of the central chips and the one of the chips.

2. The method for forming a semiconductor device structure as claimed in claim 1, further comprising:
   after the bonding of the chips to the semiconductor structure, performing a cleaning process over the chips and the semiconductor structure; and
   forming an underfill layer in a gap between the semiconductor structure and each of the chips.

3. The method for forming a semiconductor device structure as claimed in claim 1, wherein the first conductive bumps over a first surface of the central chip have a first total top surface area, the central chip has a first top surface area, the dummy conductive bumps over a second top surface of the peripheral chip have a second total top surface area, the peripheral chip has a second top surface area, a difference between a first ratio of the first total top surface area to the first top surface area and a second ratio of the second total top surface area to the second top surface area ranges from about −0.1 to about 0.1.

4. The method for forming a semiconductor device structure as claimed in claim 1, wherein a number of the dummy conductive bumps in one of the peripheral chip regions is less than a number of the first conductive bumps in one of the central chip regions.

5. The method for forming a semiconductor device structure as claimed in claim 1, wherein a minimum distance between the dummy conductive bumps in one of the peripheral chip regions is greater than a minimum distance between the first conductive bumps in one of the central chip regions.

6. The method for forming a semiconductor device structure as claimed in claim 1, wherein a first top surface of the first conductive bump has a first height with respect to the surface, a second top surface of the dummy conductive bump has a second height with respect to the surface, and the second height is less than the first height.

7. A method for forming a semiconductor device structure, comprising:
   providing a semiconductor structure, wherein the semiconductor structure has a central portion and a peripheral portion surrounding the central portion, the semiconductor structure comprises a plurality of chip regions, a plurality of predetermined scribe lines are between the chip regions, and the chip regions comprise central chip regions and peripheral chip regions; and
   forming a plurality of first conductive bumps and a plurality of dummy conductive bumps on a surface of the semiconductor structure,
   wherein the first conductive bumps are over the central portion and electrically connected to the semiconductor structure, the dummy conductive bumps are over the peripheral portion and electrically insulated from the semiconductor structure, the first conductive bumps each having a first thickness, the dummy conductive bumps each having a second thickness, the second thickness is less than the first thickness, a contact area between the dummy conductive bump and the semiconductor structure is greater than a contact area between the first conductive bump and the semiconductor structure, the first conductive bumps are in the central chip regions, and the dummy conductive bumps are in the peripheral chip regions;
   forming a plurality of second conductive bumps over chips;
   bonding the chips to the semiconductor structure through the second conductive bumps and the first conductive bumps between the chips and the semiconductor structure; and
   cutting the semiconductor structure into individual central chips and peripheral chips along the predetermined scribe lines to produce chip packages, each of the chip packages comprises one of the central chips, one of the chips, the second conductive bumps, and the first conductive bumps between the one of the central chips and the one of the chips.

8. The method for forming a semiconductor device structure as claimed in claim 7, wherein a top surface area of the dummy conductive bump is greater than a top surface area of the first conductive bump.

9. The method for forming a semiconductor device structure as claimed in claim 7, wherein the semiconductor structure comprises a substrate, a plurality of first conductive pads, a plurality of second conductive pads, and a dielectric layer,
   the first conductive pads are over the substrate of the central portion, the second conductive pads are over the substrate of the peripheral portion, the dielectric layer is over the substrate and covers the entire second conductive pads, the first conductive bumps are formed on and electrically connected to the first conductive pads, and the entire dummy conductive bumps are formed on the dielectric layer and electrically insulated from the second conductive pads.

10. The method for forming a semiconductor device structure as claimed in claim 9, wherein the first conductive bumps are in direct contact with the first conductive pads, and the dummy conductive bumps are in direct contact with the dielectric layer.

11. The method for forming a semiconductor device structure as claimed in claim 9, wherein the semiconductor structure further comprises:
   a plurality of conductive vias passing through the substrate and electrically connected to the first conductive pads.

12. The method for forming a semiconductor device structure as claimed in claim 7, wherein the peripheral chip has a curved sidewall.

13. A method for forming a semiconductor device structure, comprising:
   providing a semiconductor structure, wherein the semiconductor structure has a central portion and a peripheral portion surrounding the central portion, the semiconductor structure comprises a substrate, a plurality of first conductive pads, a plurality of second conductive pads, and a dielectric layer, the first conductive pads are over the substrate of the central portion, the second conductive pads are over the substrate of the peripheral portion, and the dielectric layer is over the substrate and covers the entire second conductive pads; and
   forming a plurality of first conductive bumps and a plurality of dummy conductive bumps over a surface of the semiconductor structure,
   wherein the first conductive bumps are over the central portion and electrically connected to the semiconductor structure, the dummy conductive bumps are over the peripheral portion and electrically insulated from the semiconductor structure, the first conductive bumps each having a first thickness, the dummy conductive bumps each having a second thickness, the second thickness is less than the first thickness, a width of the dummy conductive bump is greater than a distance between two adjacent first conductive bumps, the first conductive bumps are formed on and electrically connected to the first conductive pads, the entire dummy conductive bumps are formed on the dielectric layer and electrically insulated from the second conductive pads, and one of the dummy conductive bumps covers portions of the second conductive pads.

14. The method for forming a semiconductor device structure as claimed in claim 13, wherein the semiconductor structure comprises a plurality of chip regions, a plurality of predetermined scribe lines are between the chip regions, the chip regions comprise central chip regions and peripheral chip regions, the first conductive bumps are in the central chip regions, the dummy conductive bumps are in the peripheral chip regions, and the method further comprises:
  forming a plurality of second conductive bumps over chips;
  bonding the chips to the semiconductor structure through the second conductive bumps and the first conductive bumps between the chips and the semiconductor structure; and
  cutting the semiconductor structure into individual central chips and peripheral chips along the predetermined scribe lines to produce chip packages, each of the chip packages comprises one of the central chips, one of the chips, the second conductive bumps, and the first conductive bumps between the one of the central chips and the one of the chips.

15. The method for forming a semiconductor device structure as claimed in claim 14, wherein a first total top surface area of the first conductive bumps in the central chip region is greater than a second total top surface area of the dummy conductive bumps in the peripheral chip region.

16. The method for forming a semiconductor device structure as claimed in claim 14, wherein a number of the dummy conductive bumps in the peripheral chip regions is less than a number of the first conductive bumps in the central chip regions.

17. The method for forming a semiconductor device structure as claimed in claim 14, further comprising:
  after the bonding of the chips to the semiconductor structure, performing a washing process over the chips and the semiconductor structure;
  forming an underfill layer in a gap between the semiconductor structure and each of the chips; and
  forming a molding layer over the semiconductor structure to surround the chips, the second conductive bumps, and the first conductive bumps, wherein the cutting of the semiconductor structure further comprises:
  cutting the molding layer between the chips.

18. The method for forming a semiconductor device structure as claimed in claim 13, wherein the width of the dummy conductive bump is greater than a distance between two adjacent second conductive pads.

19. The method for forming a semiconductor device structure as claimed in claim 13, wherein a distance between two adjacent dummy conductive bumps is greater than a distance between two adjacent second conductive pads.

20. The method for forming a semiconductor device structure as claimed in claim 13, wherein the peripheral portion has a curved sidewall.

* * * * *